United States Patent
Han et al.

(10) Patent No.: US 12,298,349 B1
(45) Date of Patent: May 13, 2025

(54) GRID RELAY FAULT DETECTION

(71) Applicant: Lunar Energy, Inc., Mountain View, CA (US)

(72) Inventors: Hai-Yue Han, San Jose, CA (US); Andrew Diao, Santa Cruz, CA (US)

(73) Assignee: Lunar Energy, Inc., Mountain View, CA (US)

( * ) Notice: Subject to any disclaimer, the term of this patent is extended or adjusted under 35 U.S.C. 154(b) by 0 days.

(21) Appl. No.: 18/758,764

(22) Filed: Jun. 28, 2024

(51) Int. Cl.
| | |
|---|---|
| *G01R 31/327* | (2006.01) |
| *G01R 15/16* | (2006.01) |
| *G01R 19/165* | (2006.01) |
| *G01R 31/28* | (2006.01) |

(52) U.S. Cl.
CPC ......... *G01R 31/3278* (2013.01); *G01R 15/16* (2013.01); *G01R 19/16571* (2013.01); *G01R 31/2839* (2013.01)

(58) Field of Classification Search
CPC ............ G01R 31/3278; G01R 31/2839; G01R 15/16; G01R 19/16571
USPC ........................................................ 324/418
See application file for complete search history.

(56) References Cited

U.S. PATENT DOCUMENTS

| | | | |
|---|---|---|---|
| 11,101,635 B2 * | 8/2021 | Kwon | H02H 1/0007 |
| 2007/0205771 A1 * | 9/2007 | Drake | G01R 31/3278 324/418 |
| 2011/0187376 A1 * | 8/2011 | Barrenscheen | G01R 31/00 324/416 |
| 2016/0343526 A1 * | 11/2016 | Schicke, II | H01H 47/002 |
| 2017/0016959 A1 * | 1/2017 | Mizoguchi | G01R 31/44 |
| 2018/0254624 A1 * | 9/2018 | Son | H02H 9/001 |
| 2018/0267104 A1 * | 9/2018 | Yang | H02M 1/08 |
| 2020/0244060 A1 * | 7/2020 | Henke | H04L 67/1095 |
| 2020/0279707 A1 * | 9/2020 | Grossberg | H02H 9/04 |
| 2020/0379047 A1 * | 12/2020 | Bhusanur | G01R 31/3278 |
| 2022/0026491 A1 * | 1/2022 | Matsuo | H01H 71/04 |

FOREIGN PATENT DOCUMENTS

WO  WO-0192905 A1 * 12/2001 ......... G01R 31/3278

* cited by examiner

*Primary Examiner* — Christopher P McAndrew
(74) *Attorney, Agent, or Firm* — Van Pelt, Yi & James LLP

(57) ABSTRACT

A grid relay state detector includes an AC (Alternating Current) signal source capacitively coupled to at least one grid relay. It further includes a current sensor that detects an amount of AC current flowing through the at least one grid relay. A state of the at least one grid relay is determined based at least in part on the detected amount of AC current.

20 Claims, 9 Drawing Sheets

GRID RELAY FAULT DETECTION

BACKGROUND OF THE INVENTION

For various reasons, such as safety, onsite power systems (such as home solar power systems) are required to be able to controllably or automatically connect or disconnect from a utility grid. Fault conditions may arise in components that are used to facilitate such connection/disconnection. It would be beneficial to be able to detect the condition of such components.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
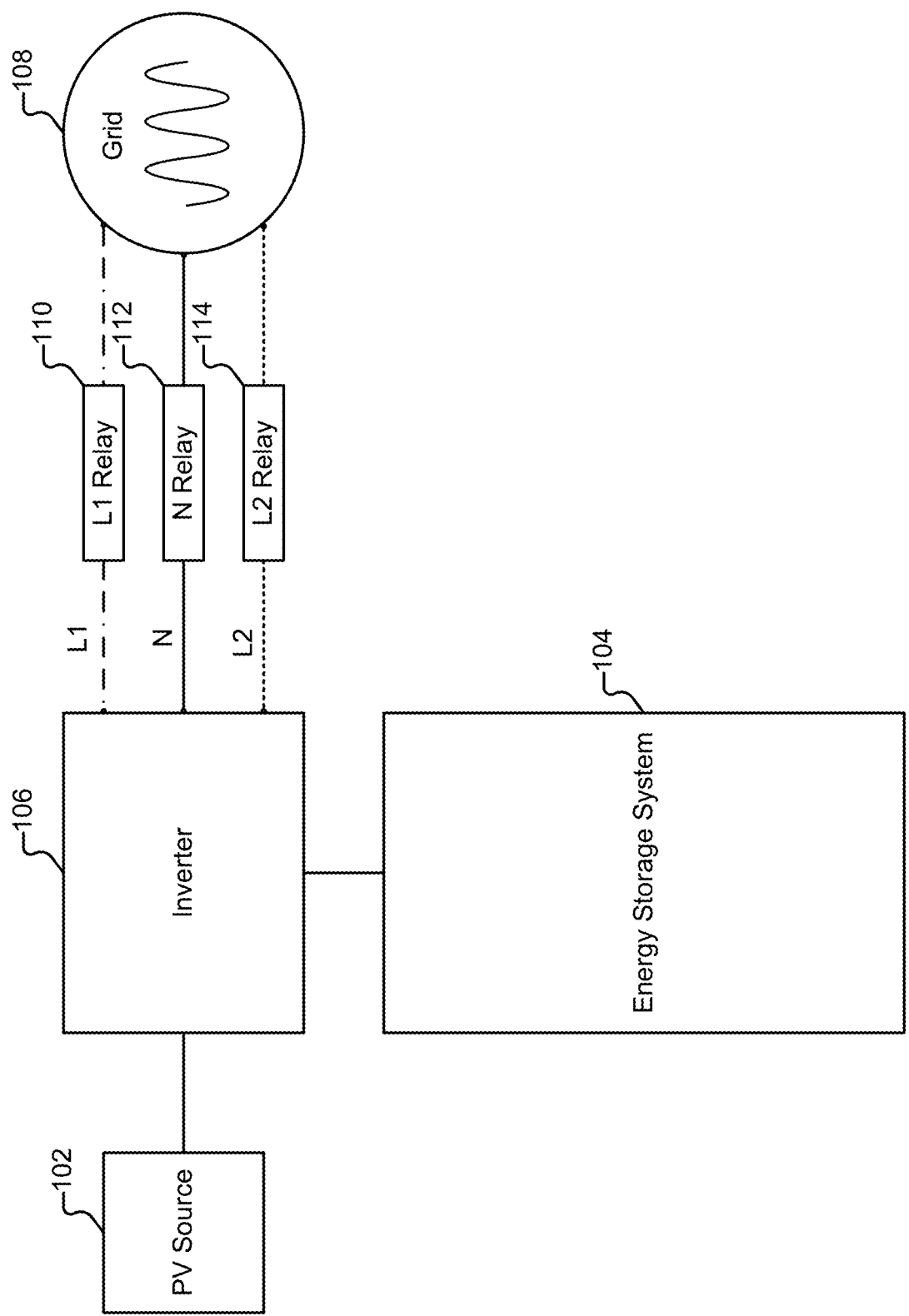
FIG. 1 illustrates an embodiment of an onsite power system.

FIG. 1 illustrates an embodiment of an onsite power system. Examples of sites that include such an onsite power system include residential and commercial sites. In the example of FIG. 1, the onsite power system includes a photovoltaic (PV) source 102, such as an array of PV panels. In this example, the onsite power system also includes an energy storage system (ESS) 104. In various embodiments, the energy storage system includes batteries, fuel cells, etc. The onsite power system further includes an inverter 106. In this example, the inverter connects to the electrical wiring of a site (e.g., commercial or home site's main breaker panel). The inverter is also connected to grid 108 (e.g., utility grid). In this example, controllable/actuatable relays 110, 112, and 114 are between the inverter 106 and the grid 108, allowing control of whether the inverter is connected to the grid (where the inverter is then referred to as operating in a "grid-tied" or "grid-connected" mode), or disconnected from the grid (where the inverter is then referred to as being in a "standalone" mode). The inverter 106 is an example of a converter that converts/inverts DC power from the PV source and/or energy storage to AC power (e.g., to deliver power to the site and/or grid, and vice versa (e.g., converting AC power from the grid to DC power to, for example, charge batteries of the energy storage system)).

As described above, the onsite power system is configurable to operate in an on-grid or off-grid mode. This includes controlling the connection and disconnection of the inverter to the grid (also referred to as an electrical power system, or EPS). For example, when connected to the grid, the inverter is a grid connected inverter that can both use solar and energy storage, as well as put power into, and take power out of, the grid.

In some embodiments, the onsite system is configured to disconnect (the inverter) from the grid in the event that an unsafe condition is detected. In some embodiments, the disconnection is facilitated by opening or otherwise controlling one or more of relays 110, 112, and 114. As one example, the relays are implemented as electromechanical relays. In the example of FIG. 1, three electromechanical relays are used.

In some embodiments, controlling the electrical mechanical relays includes controlling energy provided to coils in the relays. Opening and closing of the relays controls connection of the AC output of the inverter to the split phase power system of the home or building, which in this example includes poles/legs L1 and L2, and Neutral (N).

There are various situations in which the site power system is to be connected to, or disconnected from, the grid. When the site power system is to be connected to the grid, the grid relays are commanded to be closed. When the site power system is to be disconnected from the grid, the grid relays are commanded to be opened. If there is an issue with the grid relays (e.g., damage to the relays), then the ability to disconnect from the grid could be lost, which could potentially be unsafe.

It may be the case that commanded connection to and/or disconnection from the grid was unsuccessful. For example, even though connection to the grid was commanded, it may arise that power is not being transferred between the site power system and the grid. There may be various reasons for why the connection or disconnection was unsuccessful. For example, there may be failures in the power conversion circuitry, grid relay, components in the path of the control circuitry to the grid relay, etc.

Described herein are embodiments of grid relay fault detection techniques. In some embodiments, the grid relay fault detection techniques described herein facilitate determining whether there is an issue with a grid relay (e.g., it is stuck open because a coil has shorted, or it is welded shut and cannot open). Using the techniques described herein, it can be determined whether unsuccessful connection or disconnection was due to a malfunction in one or more of the grid relays. If there is an issue with a grid relay, then this can be flagged. If the grid relays are operating as intended, then a user can then eliminate the grid relay as a problem and search for other reasons when diagnosing connection/disconnection issues.

In some embodiments, the check of whether there is a fault in the grid relays includes determining whether contacts of any of the grid relays are welded shut or stuck open. This includes determining whether an actual state of a grid relay matches to an expected or intended or commanded state of the grid relay. As one example, fault detection is performed prior to connection to the grid. For example, prior to connection to the grid, a relay should be in the open state. Grid fault detection includes determining whether the relay is actually open, and in the intended state.

As another example, suppose that the inverter is connected to the utility grid (grid relays are closed). For safety, it is desired for the site power system to be disconnected from the grid. The relays are commanded to open. The grid relay fault detection techniques described herein are used to determine that the relays were successfully opened, as commanded (and are not stuck or welded shut). If the relays are determined to be faulty (e.g., welded shut), then remedial actions can be taken, such as powering down the site power system (e.g., shutting down the inverter) so that it is not operational.

Described in further detail below are embodiments of detecting of faults with grid connection relays. While examples involving fault detection in relays used in a split phase power system are described herein for illustrative purposes, the relay fault detection techniques described herein may be variously adapted to accommodate fault detection of grid relays used in other types of power systems, such as single phase power systems.

In some embodiments, the grid relay fault detection techniques described herein are used to fulfill safety compliance requirements or regulations with respect to faults in isolation components such as grid relays.

Figure 2:
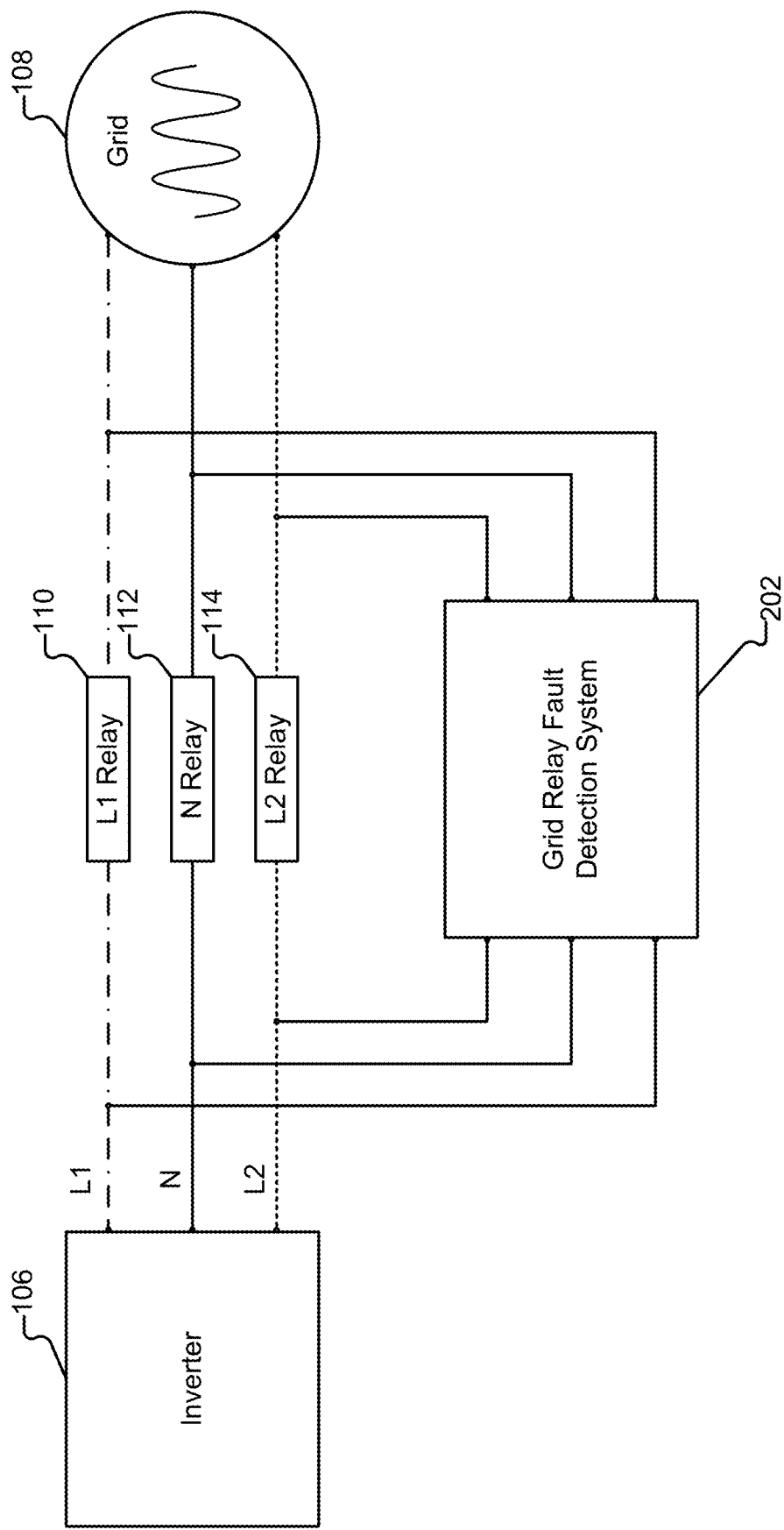
FIG. 2 illustrates an embodiment of a system for grid relay fault detection.

FIG. 2 illustrates an embodiment of a system for grid relay fault detection. In this example, grid relay fault detection system 202 (also referred to herein as a weld check system) is configured to detect a fault condition in one or more of grid relays 110, 112, and 114. The following are further embodiments of grid relay fault detection system 202.

In some embodiments, a grid relay fault is determined as a deviation or difference between a commanded relay state and a measured actual relay state. In some embodiments, a grid relay fault check is performed continuously, periodically, when a state change occurs, etc.

Mechanically Linked Auxiliary Contact

In one embodiment, grid relay fault detection is mechanically facilitated via a mechanically linked auxiliary switch or contact that is on the electromechanical relay itself. As the auxiliary contact is mechanically linked to the electromechanical relay, the state of the auxiliary contact is indicative of the state of the electromechanical relay. For example, if the auxiliary contact is closed, then this indicates that the linked electromechanical relay is also closed. The auxiliary mechanical switch is used to indicate a fault condition. For example, the state of the electromechanical relay is determined by sensing the state of the auxiliary mechanical switch. A fault is determined if the state of the auxiliary mechanical switch (which acts as a proxy for determining the actual state of the electromechanical relay) is different from an expected state.

Voltage Sensors

In one embodiment, voltage sensors are placed across the relays. In some embodiments, the voltage sensors are isolated voltage sensors that are associated with corresponding power supplies. For example, for each grid relay, an isolated voltage sensor is placed on each terminal of the grid relay (with six voltage sensors across the three grid relays in the examples described herein for illustrative purposes). The two voltage sensors across a grid relay are used to detect the voltage across the grid relay. The detected voltage is indicative of the state of the relay. The detected state of a relay (as determined based on the voltage measurements taken by the voltage sensors) can then be compared to the expected state of the relay to determine whether there is a fault or malfunction with the relay. Such use of voltage sensors is applicable across various voltage domains, such as AC split phase (L1, L2, N), as well as 3-phase AC (L1, L2, L3, N), and also DC (+,−).

Capacitively Coupled AC-Driven Grid Relay Fault Detection Circuit

The following are embodiments of a grid relay fault detector that includes a test circuit that tests the state of a grid relay via a capacitively coupled AC signal source. In some embodiments, a current sensor detects AC current from an AC voltage source flowing through a grid relay. The AC voltage source is capacitively coupled to the grid relay. The amount of measured AC current is indicative of a state of the grid relay.

In this example, mechanically linked auxiliary contacts are not needed (which can introduce additional component costs). As such, less expensive relays may be used. The techniques described herein provide a cost-effective way to detect grid relay state that does not involve auxiliary mechanical or voltage sensors, and leverages existing isolated power drivers in the system. In this way, the state of the relay can be determined without disturbing the relay, and without requiring a mechanical indicator or multiple voltage sensors.

Figure 3:
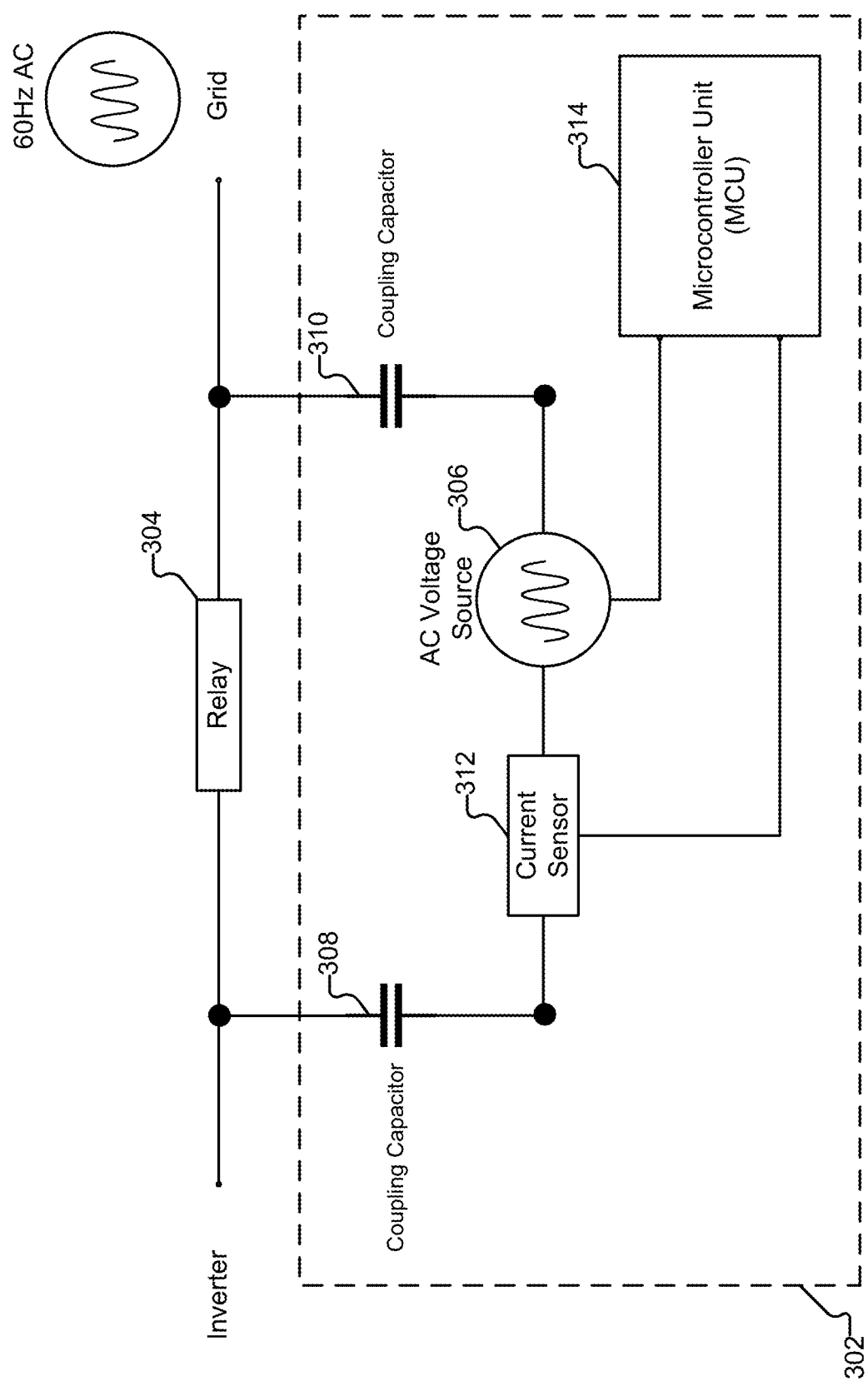
FIG. 3 illustrates an embodiment of a grid relay fault detection system.

FIG. 3 illustrates an embodiment of a grid relay fault detection system. In this example, grid relay fault detection circuit 302 (also referred to herein as a weld check circuit) is a portion of grid relay fault detection system 202 of FIG. 2. In this example, the grid relay fault detection circuit 302 is used to detect whether there is a fault with grid relay 304. L1 Relay 110, N Relay 112, and L2 Relay 114 are examples of grid relay 304. In this example, during fault detection, grid relay 304 is under test. For example, an actual state of the grid relay is tested via grid relay fault detection circuit 302 to determine whether there is a fault with the grid relay. In some embodiments, determining whether there is a fault with the grid relay includes determining whether the actual state of the relay matches to an intended, commanded, or expected state of the relay. If there is a mismatch or deviation between the tested and the expected state of the grid relay, then a fault with the grid relay is detected. If the tested state of the relay matches to the expected state of the grid relay, then no fault is detected.

In some embodiments, testing the actual state of the grid relay includes detecting whether the grid relay is open or closed. In some embodiments, the state of the relay is determined by applying a power supply across the relay contacts and measuring the current (e.g., RMS or effective current) through the relay contacts. If the magnitude of the measured current is above a threshold magnitude, then the relay is determined to be in the closed state (in which current is able to pass through the relay). If the magnitude of the measured current is below a threshold magnitude, then the relay is determined to be in the open state (in which the grid relay is open, and no current is able to pass through the grid relay). The current thresholds for determining whether the grid relay is open or closed can be the same or different.

In this example, the state of the grid relay is tested by using AC (Alternating Current) voltage source 306. In some embodiments, the AC voltage source is an AC signal source that is implemented or generated using a power supply. As one example, an isolated power supply is used to facilitate driving of the weld check circuit. In some embodiments, a push-pull transformer-based isolated power supply is used. In some embodiments, the isolated power supply includes a switching power converter to facilitate AC signal generation to drive the weld check circuit. The waveform of the AC signal can be a variety of shapes, such as a sine wave, square wave, triangle wave, etc. The onsite power system may have various isolated power supplies for powering isolated circuits in the system. Leveraging of existing isolated power supplies is efficient.

The AC voltage source is capacitively coupled across the terminals or contacts of relay 304 via coupling capacitor 308 (connected to the inverter side of the relay in this example) and coupling capacitor 310 (connected to the grid side of the relay in this example). By capacitively coupling the AC voltage source across the relay, AC signals are able to pass through the coupling capacitors, but not DC (Direct Current).

The current through the relay is measured via current sensor 312. One example implementation of current sensor 312 is a shunt resistor in series with the AC voltage source. Another example implementation of current sensor 312 is a Hall-effect sensor. In the example of the shunt resistor, current through the resistor is determined based on measuring the voltage across the shunt resistor (and dividing the measured voltage by the resistance of the shunt resistor). If the current measured through the current sensor is high (e.g., above a threshold), then it is determined that the electromechanical grid relay 304 is closed. If the current measured through the current sensor is low (e.g., be a threshold), then the grid relay is determined to be opened.

As another example of detecting the state of the relay, if a shunt resistor is utilized, the voltage across the shunt resistor in the presence of the AC voltage source is used to indicate or determine the state of the grid relay under test. For example, if the (RMS or effective) voltage drop across the shunt resistor is small (or below a threshold), then this is indicative that there is no current, and that the relay is open. If the voltage drop across the shunt resistor is large (or above a threshold), then this is indicative that there is a high amount of current passing through, and that the relay is closed.

In some embodiments, a power supply is used to supply (AC) power and implement AC voltage source 306. A current sensor is used to measure current through the relay due to the supplied AC power. The amount of current (e.g., RMS or effective value of AC current) sensed is indicative of the state of the relay. For example, if a higher current draw is observed on the power supply, this indicates that the grid relay is closed. If a low amount of current is observed, then this indicates that the relay is open. In some embodiments, the power supply is implemented using an isolated power supply.

As one example, suppose that it is being detected whether the relay is welded shut. For example, suppose that a relay has been commanded to be open. The test power supply is run through the relay contacts, and current is measured. If the current is high, then this indicates that the relay is welded shut (as it had been commanded to be open in this example). If the current is low, then the relay is determined to not be welded (as the amount of current is low, as expected, since the relay contact actually opened, as commanded).

In this example, microcontroller unit (MCU) 314 is configured to perform testing or measuring of the state of the relay and detecting of whether there is a fault with the relay. For example, the microcontroller unit is configured to control an (isolated) power supply to generate the AC voltage source 306, and receive measurements of AC current through the relay (e.g., take sensor readings from current sensor 312). As one example, the measured AC current is filtered (e.g., using an RC filter), where the filtered signal is then strengthened (e.g., using an operational amplifier (op amp)). The strengthened filtered signal is then provided as input to the MCU, which reads the strengthened filtered AC current signal to determine the amount of (RMS or effective) current that is measured as flowing.

MCU 314 is also configured to use the current sensor measurement to determine an actual physical state of the relay (e.g., open or closed). The MCU then determines if there is a fault condition with the relay based on whether the tested state of the grid relay matches an expected state of the grid relay.

In some embodiments, the state of a relay is detected or checked while connected to the grid. As described above, in one embodiment, the test signal generated by a power supply (e.g., AC voltage source 306) is an AC signal. In some embodiments, to avoid conflict with the grid AC signal, the test signal is generated at a different frequency than the utility grid signal/power. For example, suppose that the utility grid is operating at 60 Hz AC. The grid relay test AC signal is generated to be at a higher frequency, such as 200 kHz. In some embodiments, the coupling capacitors, whose impedance are a function of frequency, are sized to pass the higher frequency test signal source, while blocking the lower frequency grid AC. For example, the isolated power supply that generates AC voltage source 306 superimposes a 200 kHZ sine wave on top of the 60 Hz AC signal, such that the two signals are independent of each other. This allows the grid relay state detection to operate, even when the onsite power system is on grid. An example size of the coupling capacitors is 22 nF (nano Farads).

Figure 4:
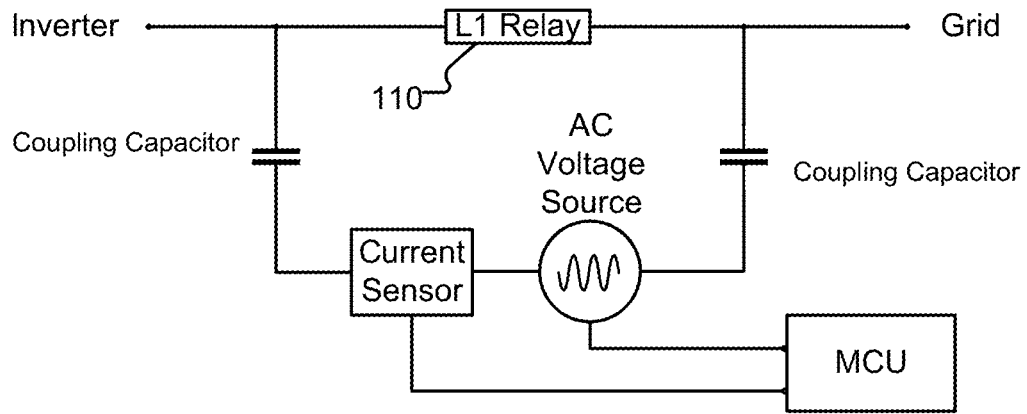
FIG. 4 illustrates an embodiment of a grid relay fault detection system.
Figure 4:
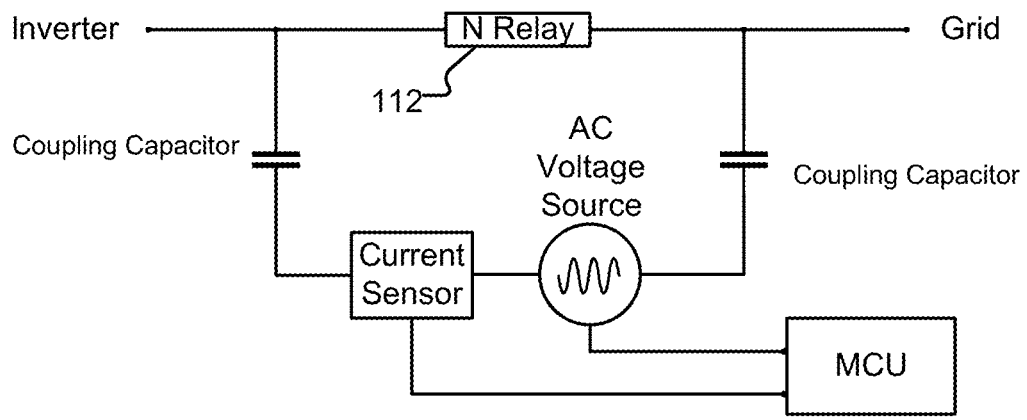
Figure 4:
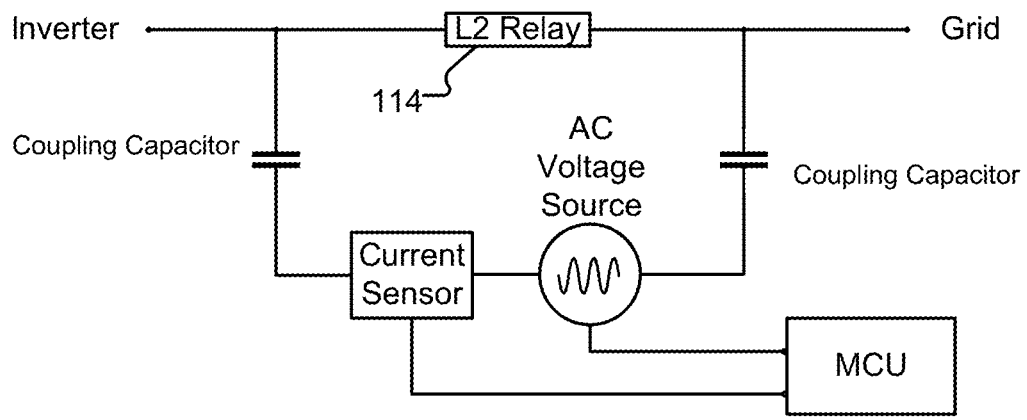

In some embodiments, each of relays 110, 112, and 114 is associated with a corresponding individual instance of grid relay fault detection circuit 302. An example of such a configuration of a grid fault detection system is shown in FIG. 4. In this example, each relay is associated with its own individual fault detection circuit. In the example of FIG. 4, each individual grid relay can be monitored and tested for fault conditions, and which grid relays are faulted (if any) can be individually and specifically identified. In this example, while each instance of the fault detection circuit includes its own MCU, in other embodiments, a single MCU is used to control multiple (e.g., two or more) of the fault detection circuits.

Multi-Relay State Detection Circuit

Using the configuration of FIG. 4, if there is a fault condition in a relay (e.g., because the relay is stuck shut or stuck open), which particular relay is faulted can be independently identified. To satisfy some safety requirements, it is sufficient to detect that any of the relays have faulted, without needing to know which particular relay(s) are shorted. The following are embodiments of a multi-relay fault detection circuit that can detect the presence of a fault condition if any of the relays are faulted.

Figure 5:
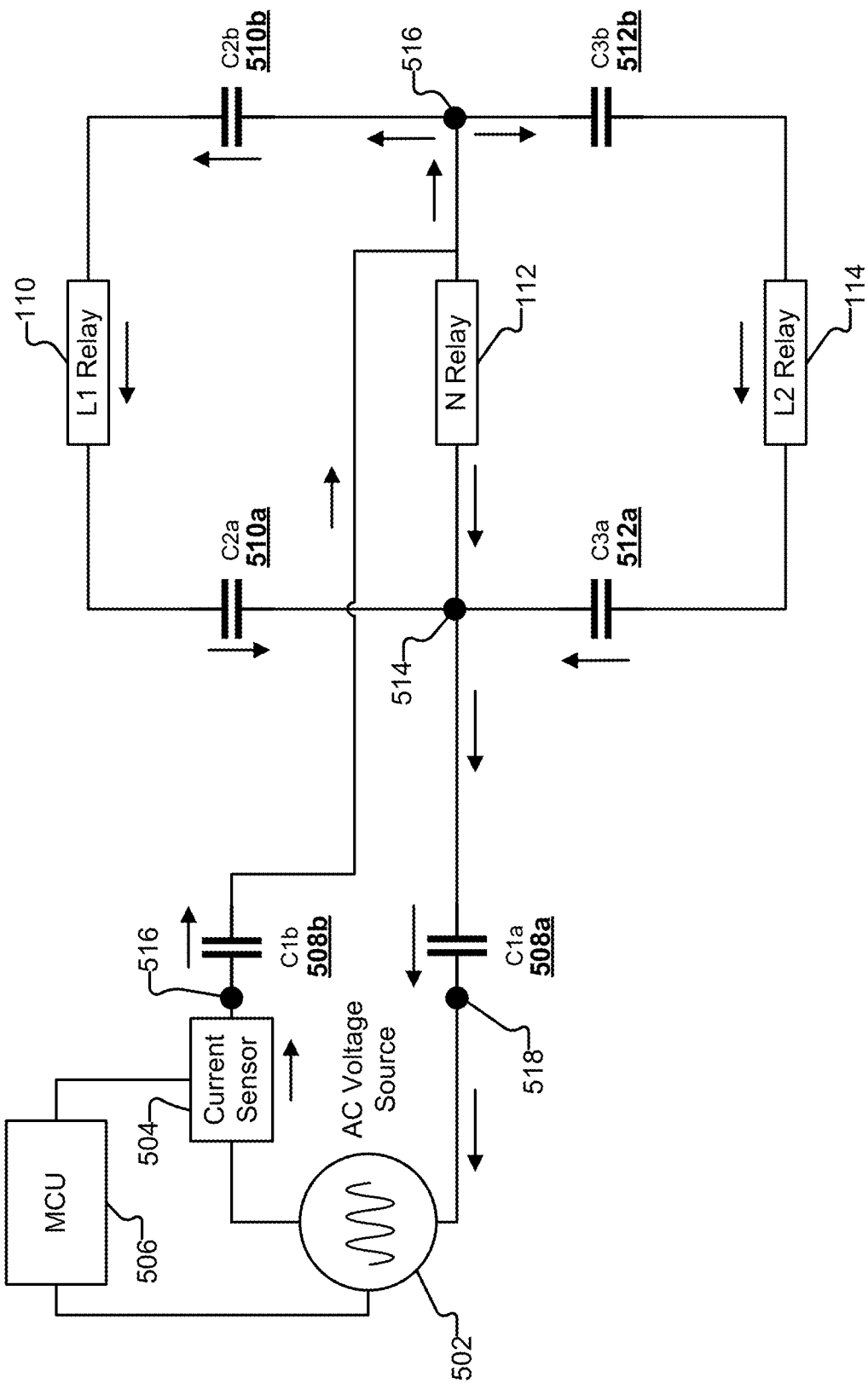
FIG. 5 illustrates an embodiment of a multi-relay fault detection circuit.

FIG. 5 illustrates an embodiment of a multi-relay fault detection circuit. In this example, the fault detection circuit includes AC voltage source 502, current sensor 504, and MCU 506. In this example, the MCU 506 facilitates generating AC voltage source 502 and reads current sensor measurements from current sensor 504. In this example, the AC voltage source is not only coupled across a single relay, but is capacitively coupled through a capacitor network to the other two relays as well. In this way, the AC energy that is sent to the relays (via AC voltage source 502) is capacitively coupled to all three lines (L1, L2, and N). In this way, there is a complete circuit by which AC current can flow from/to the power supply if any one of the L1, L2, or N relays are closed (and thus the MCU can detect if any of the relays are closed).

The use of the capacitor network configuration described herein provides resource savings by reducing the number of components needed to satisfy the requirements for grid relay fault detection. For example, rather than multiple AC voltage sources and current sensors, a single AC voltage source and a single current sensor can be used to facilitate grid relay fault detection.

In this example, the capacitor network includes capacitors that provide various paths for AC current to flow through grid relays (if closed). For example, the capacitor network is structured such that as long as there is one grid relay closed, there is a path for current to flow through from the AC signal source and back. Examples of potential paths for AC current are shown in the example of FIG. 5.

For example, the AC signal source (and current source) is capacitively coupled to nodes 514 and 516 via coupling capacitors 508a and 508b, respectively. In this example, the contacts of the neutral relay 112 are coupled to nodes 514 and 516. When the neutral relay is closed, this allows for a path for AC current that can travel through the neutral relay. In this example, L1 relay 110 is capacitively coupled to nodes 514 and 516 via coupling capacitors 510a and 510b, respectively. In this example, L2 relay 114 is capacitively coupled to nodes 514 and 516 via coupling capacitors 512a and 512b, respectively. Via the coupling capacitors, AC current can also flow through nodes 514 and 516 to L1 relay 110 and L2 relay 114 (if they are closed). While one example configuration of relays is shown in the example of FIG. 5 for illustrative purposes, the placement of relays 110, 112, and 114 can be different (such as with the placement of the L1 relay swapped with that of the L2 relay, as one example).

As shown in the example of FIG. 5, the AC signal source is capacitively coupled to multiple grid relays. For each individual grid relay, the AC signal source is capacitively coupled across the terminals of the individual grid relay by one or more pairs of coupling capacitors. For example, the AC signal source 502 (which in some embodiments is an AC voltage source) is capacitively coupled across the grid-side and inverter-side terminals of the N relay 112 by the pair of coupling capacitors including capacitors 508a and 508b. In FIG. 5, the AC signal source is capacitively coupled across the grid-side and inverter-side terminals of the L1 relay 110 via two pairs of coupling capacitors: the pair of capacitors 508a and 508b, and the pair of capacitors 510a and 510b. Similarly, the AC signal source is capacitively coupled across the grid-side and inverter-side terminals of the L2 relay 114 via two pairs of coupling capacitors: the pair of capacitors 508a and 508b, and the pair of capacitors 512a and 512b As described above, in this example arrangement, an AC signal source and current sensor are capacitively coupled to nodes to which contacts of a first grid relay are connected. For example, in FIG. 5, AC voltage source 502 and current sensor are capacitively coupled via capacitors 508a and 508b to nodes 514 and 516, to which the contacts of neutral relay 112 are connected. The contacts of another relay (e.g., L1 relay 110 and/or L2 relay 114 in the example of FIG. 5) are capacitively coupled to the nodes to which the contacts of the first grid relay are connected. For example, the contacts of L1 relay 110 are capacitively coupled to nodes 514 and 516 via coupling capacitors 510a and 510b, respectively. As another example, the contacts of L2 relay 114 are capacitively coupled to nodes 514 and 516 via coupling capacitors 512a and 512b, respectively. As shown in this example, each end (e.g., contact/terminal) of a relay is connected with a coupling capacitor. The use of such an arrangement of coupling capacitors connecting multiple relays allows a path for current to flow from and return to the AC signal source, so long as at least one relay is in the closed state.

As shown in this example, if any of the relays are closed, there is a path for AC current to flow from, and return to, the power supply/AC voltage source (and through the current sensor). For example, if both the Neutral and L2 relays were open, but the L1 relay was closed, there is still a path (via coupling capacitors 508b and 510b, L1 Relay 110, and coupling capacitors 510a and 508a) for AC current to flow from, and return to the power supply (that generates or provides AC signal source 502). This results in a non-zero amount of current flowing through the detection circuit that can be measured by the current sensor. If all of the relays are open, then there is no path for AC current to flow, and low to zero current would be detected via the current sensor, even in the presence of the AC voltage test signal generated by the MCU. While an example involving three grid relays is shown in FIG. 5, the network arrangement can be extended to accommodate or facilitate relay state detection of any number of relays, as appropriate.

In some embodiments, the MCU 506 is configured to determine a number of relays that are open/closed based on the measured amount of AC current. For example, from the perspective of the AC signal, the coupling capacitors act as impedances. The amount of AC current that passes through the current sensor 504 will vary depending on the equivalent capacitance seen from the perspective of the current sensor/AC signal source, which in turn is dependent on the number of relays that are closed/open, as there will be different numbers of paths for current to flow, and the equivalent capacitance seen from the perspective of the current sensor/AC signal source will differ (and affect the amount of current that is drawn). For example, the current that will be drawn from the power supply will be different if there is one relay closed (and two relays open), versus two relays closed (and one relay open), versus all three relays closed (and zero open), as the AC current will be able to flow through different circuit configurations involving different numbers of capacitors.

The measured amount of current can also be used to identify or at least facilitate deducing which of the relays are closed.

As one example, for illustrative purposes, suppose that all of the coupling capacitors (508a, 508b, 510a, 510b, 512a and 512b) are all of the same capacitance value. Now also suppose three example cases in which only one relay is closed, and the other two relays are open: case (1) N relay closed, L1 and L2 relays open; case (2) L1 relay closed, N and L2 relays open; case (3) L2 relay closed, N and L1 relays open. In case (1), if the N relay 112 is the only relay that is closed (and the L1 and L2 relays are open), then the only capacitors that AC current is able to flow through is the single pair of capacitors 508a and 508b. In case (2) or case (3), however, where it is only one of L1 or L2 that is closed, then there are two pairs of coupling capacitors that AC current can flow through: 508a, 508b, 510a, and 510b in case (2); 508a, 508b, 512a, and 512b in case (3). Due to the different network of capacitors that current can pass through, the AC current measured in case (1) will be different to what is measured in cases (2) or (3). In some embodiments, the MCU 506 uses the different amounts of measured current to determine whether it is the neutral relay that is closed or one of the L1/L2 relays that is closed (e.g., to distinguish between case (1), versus cases (2) or (3)). As shown in this example, different amounts of measured current can be used to distinguish between different combinations of states (e.g., open/closed) of the L1, L2, and N relays.

As shown in the above examples, in some embodiments, if a non-zero amount of current is measured, not only is this indicative that at least one grid relay is open, but the measured amount of current can also be indicative of the number of relays (and which) that are closed (or the number of relays that are open).

The following is another example of using different measured amounts of currents to distinguish between different combinations of states of grid relays. In some embodiments, the coupling capacitors 508a, 508b, 510a, 510b, 512a and 512b are sized relative to each other such that different combinations of closed/open relays (which would result in different combinations of coupling capacitors that AC current can flow through) result in different corresponding amounts of current, where the amount of measured current is indicative of which specific relay (or specific combination of relays) is closed (or open). For example, the MCU is programmed with a mapping that maps different ranges of measured current to different relays (or combinations of relays) being closed. In this way, the particular relay(s) that are closed can be identified.

As one example, suppose that the coupling capacitors are grouped into three pairs (based, for example, on being connected to contacts of a particular grid relay): (508a, 508b), (510a, 510b), and (512a, 512b). Suppose that the capacitors within a pair are the same capacitance value (C_508a=C_508b; C_510a=C_510b; C_512a=C512b). Suppose, however, that different pairs of capacitors have different capacitances. For example, suppose that the pair of capacitors connected to the terminals of the L1 grid relay have different capacitance values as compared to the pair of capacitors connected to the terminals of the L2 grid relay. The different permutations or combinations of which grid relays are open/closed would yield different effective capacitances as observed by the AC voltage source, thus yielding different AC currents that would be drawn. Different amounts of AC current can be mapped to different combinations of grid relays being opened/closed. During test time, the measured or observed AC current can be compared against the mapping (or used to perform a lookup of the mapping) to determine what combination of states the grid relays are in.

The use of the network or arrangement of coupling capacitors shown in the example of FIG. 5 provides an additional cost saving benefit while complying with safety requirements for detecting grid relay faults (e.g., by reducing the number of components utilized in the fault detection circuit/system).

As shown in the examples of FIGS. 3 and 5, an AC signal source (along with a current sensor in series with the AC signal source) is capacitively coupled in parallel with a grid relay via coupling capacitors. For example, each terminal of a grid relay is coupled to one end of the combined AC signal source/current sensor unit via one or more coupling capacitors. For example, in the example of FIG. 5, one terminal of L1 relay 110 (e.g., inverter side terminal) is coupled to the current sensor (at node 516) at least in part via coupling capacitors 510b and 508b. The other terminal of L1 relay 110 (e.g., grid side terminal) is coupled at least in part to the other end of the AC voltage source (at node 518) via coupling capacitors 510a and 508a.

Grid Relay Fault Detection in the Presence of EMC Filtering

In some embodiments, the inverter further includes an electromagnetic compatibility (EMC) filter board that includes Class-X and Class-Y safety capacitors for electromagnetic interference (EMI) suppression. The following are embodiments of the multi-relay fault detection of FIG. 5 in the presence of such EMI suppression.

Figure 6:
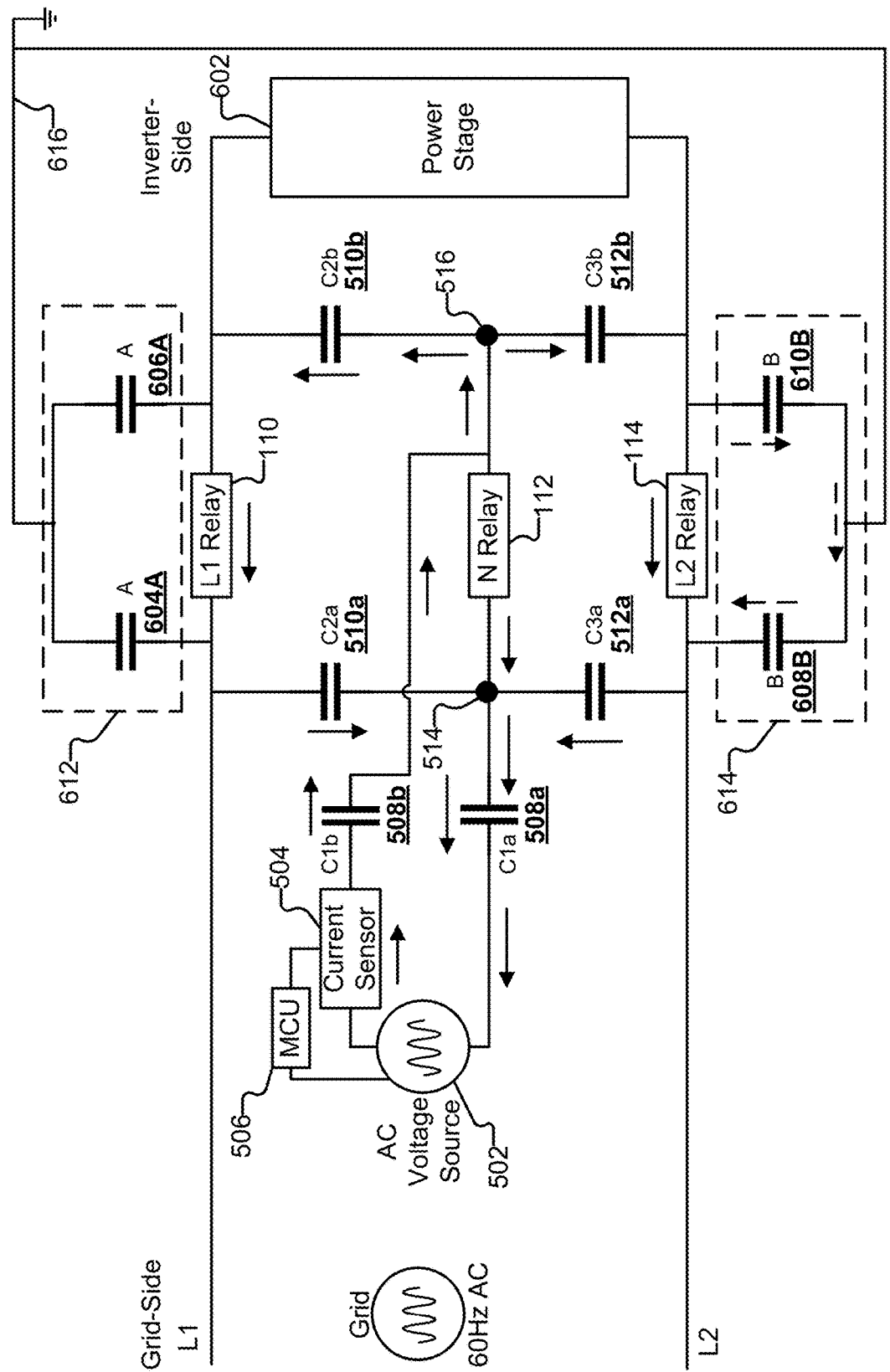
FIG. 6 illustrates an embodiment of grid fault relay detection.

FIG. 6 illustrates an embodiment of grid fault relay detection in the presence of EMI suppression. In this example, one side of the relays are connected to a power stage 602 of the inverter of the onsite power system. For example, the power stage includes switching MOSFETs. The power stage is a source of EMC noise in the system. To filter such noise, the site power system includes capacitor networks 612 and 614 of EMI suppression capacitors to reduce the amount of electromagnetic interference emitted or radiated by the power stage. In this example, capacitor network 612 includes capacitors 604A and 606A. Capacitor network 614 includes capacitors 608B and 610B. As one example, the EMI suppression capacitors are implemented using Y capacitors. In this example, the EMI suppression capacitors are connected to the same terminal or net 616, protective Earth.

In the example shown in FIG. 6, the network 612 of EMI suppression capacitors is across the terminals of L1 relay 110, and the network 614 of EMI suppression capacitors is across the terminals of L2 relay 114. While the EMI suppression capacitors are used to clean up and filter the EMI noise coming from the power stage, they can impact the ability to detect the state of the grid relays. For example, the placement and sizing of the capacitances of the EMI suppression capacitors can provide alternative paths for AC current to flow, and potentially make it difficult for the relay state detection circuitry (MCU 506, AC voltage source 502, and current sensor 504) to distinguish between a short and an open state of a grid relay.

For example, consider EMI suppression network 614. To an AC signal (such as AC current resulting from AC voltage source 502), capacitors 608B and 610B of network 614 could provide a potential alternative current path that is in parallel with the L2 relay, based on their sizing. For example, even if the L2 relay is open (and no current can pass through the L2 relay), based on the sizing of the EMI suppression capacitors (which could provide a low impedance path for the AC test signal, or that otherwise do not block the AC test signal), current could flow across the terminals of the relay through the parallel path. The MCU would then have difficulty distinguishing whether sensed AC current is due to the L2 relay being closed, or if the L2 relay is open, but current is returning through the EMI suppression capacitors. For example, if the capacitors in the network 614 are too large (or the equivalent capacitance is too large), then a measurable amount of current could pass through the parallel path involving capacitors 608B and 610B that could falsely be interpreted by the MCU as L2 relay 114 being closed (even if it were open).

In some embodiments, the EMI suppression capacitors are sized in a manner to address such a potential issue that may prevent the relay state detection from distinguishing between whether a relay is open or closed. Further embodiments of such EMI suppression capacitor sizing are described below.

Figure 7:
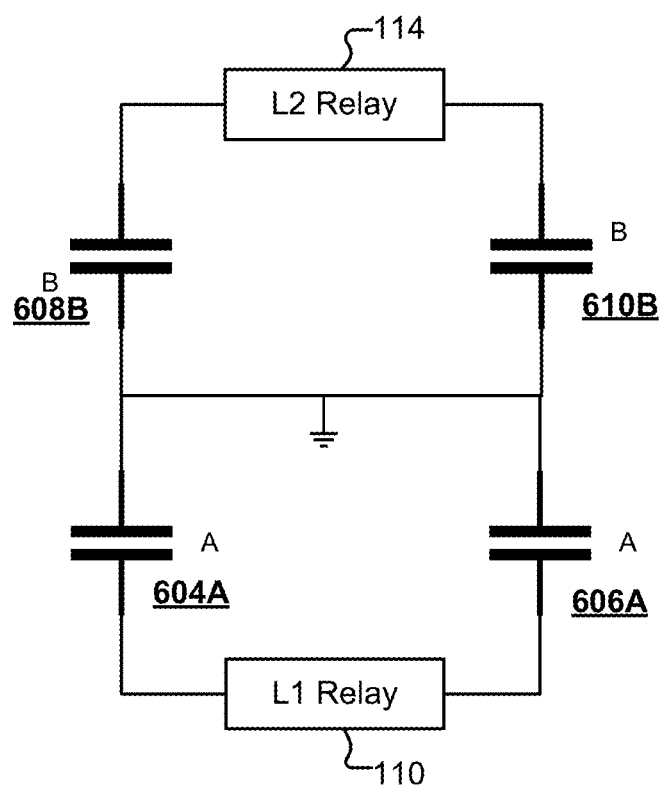
FIG. 7 illustrates an embodiment of a capacitor network.

In some embodiments, the equivalent capacitance of the EMI suppression capacitors in the networks 612 and 614 are sized to be much smaller in value than the coupling capacitors (e.g., 508a, 508b, 510a, 510b, 512a, and 512b). An alternative view of the equivalent capacitance of the EMI suppression networks is shown in the example of FIG. 7. For example, by making the equivalent capacitance across a relay to be much smaller than the coupling capacitances, while there may be some small, non-zero amount of AC current flowing through the EMI suppression networks, the amount of current will be below a threshold value that allows the detection circuitry to detect the state of the relay. For example, the capacitors are sized to be small so that the non-zero current through the EMI suppression network will be small as compared to the current that would be measured if the relay were closed. For example, when closed, the relay will provide a path of much lower impedance than that of the EMI suppression network. In this way, based on the amount of current that is measured, the detection circuit can differentiate between whether the relay is closed, or whether the relay is open, and any measured current is flowing through the parallel path of the EMI suppression circuits.

In some embodiments, the equivalent capacitance of the network of EMI suppression capacitors is sized or designed to be much smaller in the value of the coupling capacitors. For example, the equivalent capacitance (across a relay) of the EMI suppression capacitors is designed to be a quarter order, a half order, or an order of magnitude (or more) smaller than a coupling capacitor.

In some embodiments, the limiting of the equivalent capacitance across a relay is facilitated by asymmetric sizing of the EMI suppression capacitors in network 612 and the EMI suppression capacitors in network 614. For example, the capacitors in the network 612 are the same size. The capacitors in the network 614 are the same size. However, the capacitors in network 612 are sized differently from the capacitors in network 614. This asymmetry in EMI suppression capacitors ensures that the equivalent capacitance is smaller than the smallest individual capacitance in the EMI suppression networks. This is one example way to lower or limit the equivalent capacitance of the EMI suppression network across a relay.

Redundancy

Figure 8:
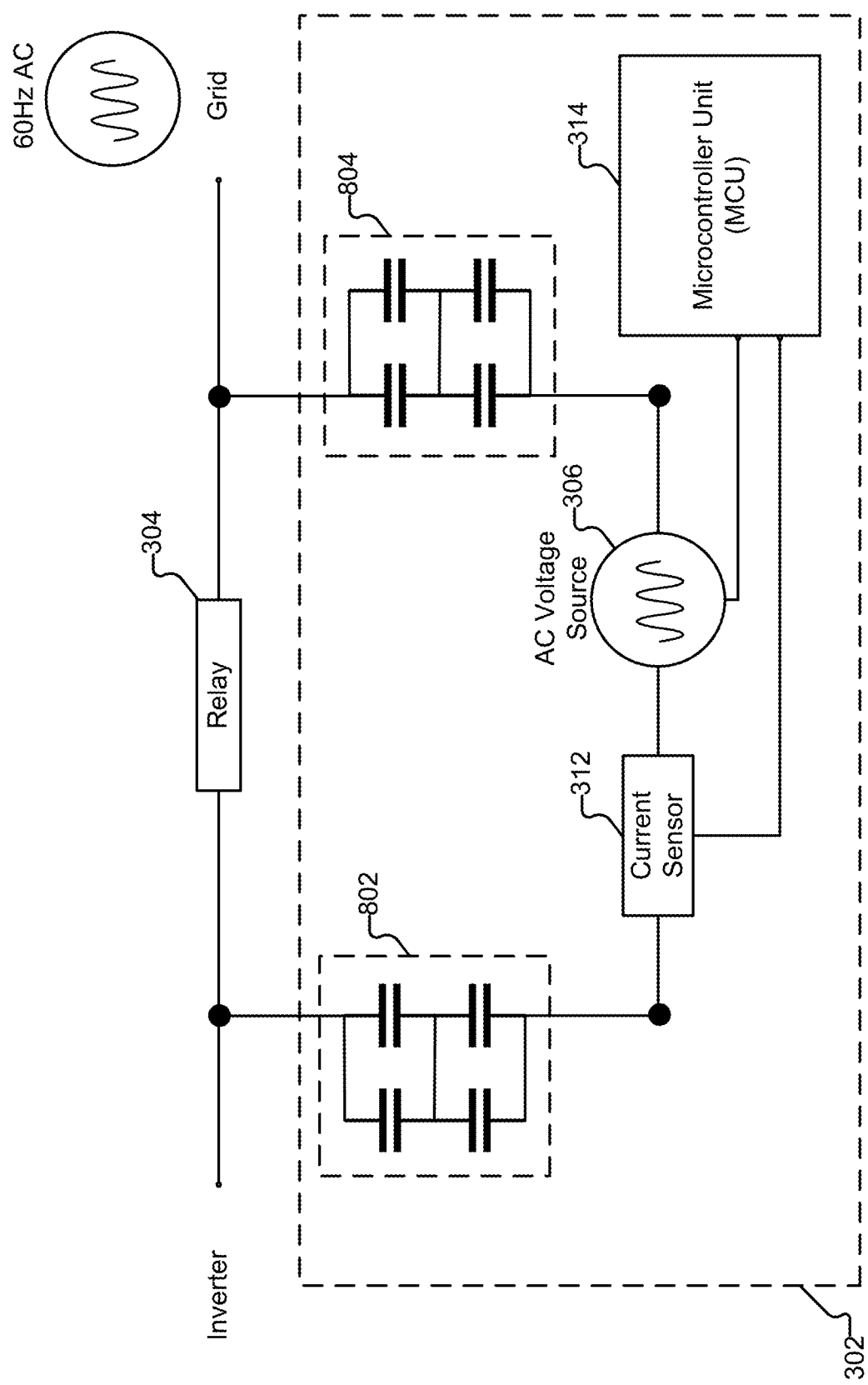
FIG. 8 illustrates an embodiment of an array of coupling capacitors.

As described above, by capacitively coupling the AC voltage source across a relay, AC signals are able to pass through the coupling capacitors, but not DC (Direct Current). In some embodiments, an arrangement or array involving multiple capacitors is used for redundancy (e.g., in case a coupling capacitor shorts). In the example of FIG. 8, an array of four capacitors is used to provide redundancy for AC coupling in case any of the capacitors short.

FIG. 8 illustrates an embodiment of an array of coupling capacitors for redundancy. In this example, an alternative embodiment of FIG. 3 is shown in which the coupling capacitors are substituted with an array of coupling capacitors for redundancy. For example, coupling capacitor 308 is substituted with coupling capacitor network 802, and coupling capacitor 310 is substituted with coupling capacitor network 804.

In this example, a coupling capacitor network (e.g., network 802) includes four capacitors. In this example, the four capacitors are arranged as follows: a first pair of capacitors in parallel, and a second pair of capacitors in parallel, where the first and second pairs of capacitors are connected in series. As one example, each capacitor in the network is the same size. The equivalent capacitance of the network is then the same as the capacitance of a single capacitor in the network. For example, if each of the four capacitors in the network is 22 nF, then the equivalent capacitance of the network is also 22 nF.

In the example of FIG. 5, each of the coupling capacitors can be similarly substituted with the network of coupling capacitors for redundancy shown in the example of FIG. 8.

Figure 9:
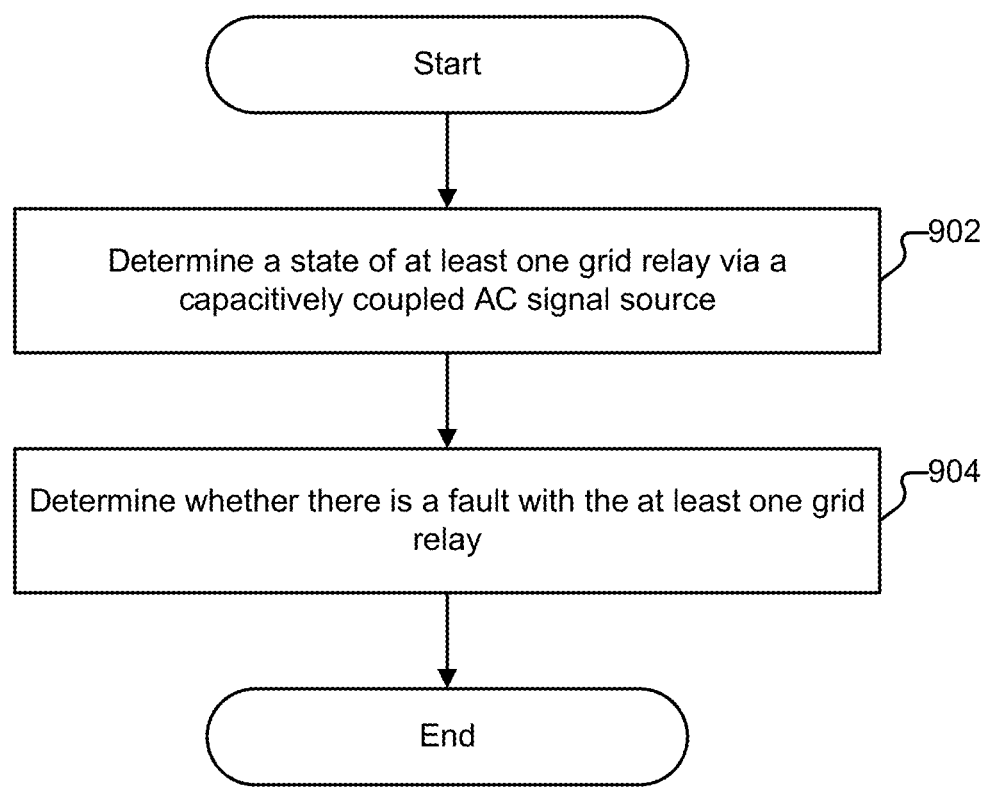
FIG. 9 is a flow diagram illustrating an embodiment of a process for grid relay fault detection.

FIG. 9 is a flow diagram illustrating an embodiment of a process for grid relay fault detection. In some embodiments, process 900 is executed by microcontroller units such as MCU 314 and MCU 506. The process begins at 902 when a state of at least one grid relay is determined via a capacitively coupled AC signal source. The AC signal source can be capacitively coupled to a single relay (e.g., to test the state of an individual relay, as shown in the examples of FIGS. 3 and 4). The AC signal source can also be capacitively coupled to multiple relays (e.g., as shown in the example of FIG. 5). In some embodiments, determining the state of the at least one grid relay includes determining an individual state of a grid relay, a collective state of multiple relays, or a combination of both (e.g., both individual states of grid relays in a set of multiple relays, and a collective state of the set of multiple relays). As one example, in the case of an individual grid relay, determining or testing grid relay state includes determining whether the grid relay is closed or open. As another example, in the case of multiple grid relays, the determining or testing of the state of the grid relays includes determining whether any of the grid relays in the set is closed (or that all of them are open).

In some embodiments, the AC signal source or AC source generator is a portion of a testing circuit used to test the actual state of the at least one grid relay to which the AC signal source is capacitively coupled. For example, an AC source generator is used to generate an AC source or signal (e.g., 200 kHz AC voltage source). The AC signal source is capacitively coupled across the terminals of the at least one grid relay via coupling capacitors. For example, each grid relay is located between an onsite power system and a grid. One terminal of a grid relay is connected to the onsite power system (e.g., AC output of an inverter), and the other terminal is connected to a utility grid. An AC current sensor is in series with the AC signal source. When a grid relay is closed, a complete circuit is formed that allows AC current to flow from the AC signal source (and through the current sensor) and back, via a path formed via the coupling capacitors and the closed grid relay(s). When a grid relay is open, there is no path (that involves the open grid relay) for AC current to flow from the AC signal source and back. In the case of multiple relays being tested using a single AC signal source, any one of the grid relays being closed will form a complete circuit for current to flow from/to the power supply. In the case of multiple relays being tested using a single AC signal source, no (or very little) AC current will flow if all of the capacitively coupled grid relays are open.

AC current responsive to the AC signal source is measured, for example, using a current sensor, such as a Hall-effect sensor, shunt resistor, etc. The state of the at least one grid relay is determined based on the amount of measured current. For example, the current sensor detects AC current from the AC signal source. The presence or absence of AC current, or the amount of current measured, is indicative of the state of the at least one grid relay. As described above, various current thresholds can also be used to determine the state of the at least one grid relay. For example, if an individual grid relay is coupled to the AC signal source, one or more current thresholds can be used to determine whether the grid relay is open or closed (e.g., closed if the current is above a threshold, open if the current is below a same or different threshold). If multiple grid relays are being tested using the AC signal source, then current thresholds can also be used to determine a collective state of the set of multiple relays, such as whether any of the grid relays are closed, as well as other associated information, such as the number of relays that are closed, etc.

In some embodiments, the coupling capacitors of the testing circuit are sized to pass AC current at an AC test frequency (e.g., 200 kHz), while blocking lower frequency AC signals (e.g., 60 Hz grid/inverter signal). In some embodiments, the coupling capacitors are sized relative to EMI suppression capacitors to block alternative paths for AC test current to pass that do not involve grid relays. For example, the equivalent capacitance of the network of EMI suppression capacitors that are across a grid relay is sized to be much smaller (e.g., at least one order of magnitude smaller) than the value of a coupling capacitor. As one example, a coupling capacitor is 22 nF, and the equivalent capacitance of the network of EMI suppression capacitors across a grid relay does not exceed two nanoFarads (one order of magnitude smaller).

As described above, in various embodiments, current thresholds are used to determine if a grid relay is open or closed. One example current threshold is on the order of 30 mA (milliamps). The current thresholds or range of current thresholds utilized can vary based on a variety of factors. For example, the range of current thresholds can vary (e.g., by at least an order of magnitude in either direction, either larger or smaller) depending on various implementation or application factors. Examples of such factors upon which current thresholds can be determined or selected include coupling capacitor values, switching frequency of the weld check/grid relay fault detection circuit (e.g., frequency of the AC signal source or isolated power supply), Y-capacitance values (e.g., capacitor values used for EMI suppression), effective impedance of the driver of the weld check circuit (e.g., AC signal source or isolated power supply), layout, as well as waveform shape of the weld check driver circuit (e.g., AC signal source or isolated power supply) output (e.g., square wave versus triangle wave, versus sine wave, etc.).

At 904, it is determined whether there is a fault condition with the at least one grid relay. For example, the determined state of the at least one grid relay is compared to an expected state of the at least one relay. As one example, if a single, individual relay is being tested, the measured state of the single relay (open or closed) is compared with the expected state of the grid relay. As another example, if multiple relays are being checked, the state of the grid relays (e.g., all open or at least one closed) is compared against an expected state of the set of multiple relays (e.g., collective expected state of all having been commanded to be opened, or another collected expected state, as appropriate) If there is a mismatch between the detected state of the at least one grid relay and the expected state of the at least one grid relay, then a fault condition in the at least one grid relay is detected. In some embodiments, if a fault condition with the at least one grid relay is detected, an alert or notification is sent or transmitted indicating that there is a fault with one or more grid relays. In some embodiments, automated actions can be taken in response to detection of grid relay faults, such as automatic shutdown of components of an onsite power system (e.g., shutting down of inverter).

As described above, in some embodiments, grid relay testing includes determining whether the state/condition of at least one grid relay matches to a commanded state/condition. In some embodiments, grid relay testing includes generating a health check report. In some embodiments, the health check report includes a report indicating whether there is a fault detected in the grid relays (e.g., whether the grid relays, individually or collectively (or in aggregate) are in a state that matches to an expected/commanded state, or whether there is a discrepancy or deviation between the actual and expected states). As described above, in some embodiments, generating the health check report includes comparing the detected state of the at least one grid relay to the expected state of the at least one grid relay.

For example, suppose that there are three grid relays in the onsite power system, and all three grid relays are collectively commanded to be closed. The state of the grid relays is then tested. As described above, the collective state of the grid relays can be determined (e.g., whether they are all open, or if any of them are closed). The state of individual grid relays can also be determined.

A comparison is then made between the tested state of the grid relays and the commanded state of the grid relays. Based on the comparison, the health check report indicates whether there is a fault with the grid relays. For example, if the tested and commanded grid relay states match, then no fault condition is indicated. If there is a discrepancy or deviation between the tested/actual and commanded grid relay states (and there is not a match between them), then a fault condition is indicated in the health check report. For example, as described above, in the case of multiple grid relays being tested via a single AC source, the amount of measured current is indicative of the number of grid relays that are closed/open (as different numbers of relays that are open/closed change the number of coupling capacitors that AC current can pass through). If the amount of current measured is non-zero (indicating that at least one grid relay is closed), the amount of current measured can further be used to determine the number of grid relays that are closed. For example, the state of all three grid relays being closed can be associated with a threshold range of current. If this threshold range of current is not met, then this is indicative that not all of the grid relays are closed. If all of the grid relays had been commanded to be closed, then this indicates a fault with at least one grid relay in the set of multiple grid relays. As another example, measured current being below a threshold can be mapped to all grid relays being in the open state. If all of the grid relays were commanded together to be opened, and the measured current is below the threshold current corresponding to all grid relays being open, then the actual collective state of the set of multiple grid relays matches to the commanded collective state of the set of grid relays, and the grid relays pass the grid relay health check test.

As another example, if a grid relay is commanded to be closed, but it is detected to still be open, then a fault is indicated. If the grid relay is commanded to be closed, and it is detected to be closed, then no fault is detected. If a relay is commanded to be open, but it is detected to still be closed, then a fault is indicated. If the grid relay is commanded to be opened, and it is detected to be opened, then no fault is detected. In some embodiments, a health report is generated that indicates a health of the grid relay (e.g., whether there is a fault or not with the grid relay based on the testing). In some embodiments, the testing is performed periodically. In some embodiments, the testing is performed in response to a change in a state of the MCU, such as when a change in state of the relay is commanded (e.g., commanded to open or to close).

The following are further examples regarding health testing and fault detection of grid relays. In some embodiments, and as described in further detail above, a grid relay is associated with a corresponding individual testing circuit. In other embodiments, and as described in further detail above, a testing circuit is used to test multiple relays, and to determine whether any relay in a set of multiple relays is open or closed.

Suppose the case of each grid relay being associated with its own individual instance of a testing circuit (e.g., as shown in the example of FIG. 3). In this case, the state of each grid relay is individually tested. An AC signal source (e.g., AC voltage source implemented by an isolated power supply) is coupled, via coupling capacitors, across the terminals or contacts of the grid relay (e.g., one coupling capacitor connected to the inverter side of the relay, and another coupling capacitor connected to the grid side of the relay). A current sensor is in series with the AC signal source. For example, one side of the current sensor is connected to a first side of the AC signal source. The other side of the current sensor is then coupled via a first coupling capacitor to a terminal of the grid relay (e.g., inverter side). The other terminal of the grid relay (e.g., grid side) is then coupled via a second coupling capacitor to the other side of the AC signal/AC source generator. An example of such a configuration is shown in the example of FIG. 3.

When a grid relay is closed, a closed or complete circuit for AC current to flow is formed that allows AC current to flow from, and return to, the AC signal source via the coupling capacitors and the closed grid relay. The amount of current that flows through the closed circuit is measured by the AC current source in series with the AC signal source. If the grid relay is open, then there is no path (that involves the grid relay) for current to flow from, and back to, the AC signal source. In some embodiments, if a tested current is above a threshold current, then this is an indication that the relay is closed. If the tested current is below a threshold current, then this is an indication that the relay is open. The current thresholds for determining whether the relay is open or closed can be different.

Suppose the case of a single testing circuit used to test the state of a set of grid relays (e.g., to determine if any of the grid relays are closed), such as shown in the example of FIG. 5. As described above in conjunction with the example of FIG. 5, in this case, the testing circuit is capacitively coupled to multiple relays. For example, an AC signal source and current sensor are capacitively coupled (via or through a network of multiple capacitors) across the terminals of multiple grid relays. If at least one of the grid relays is closed, a closed or completed circuit is formed that allows AC current to flow from, and return to, the AC signal source (e.g., AC voltage source implemented via isolated power supply) via the at least one closed grid relay and the network of coupling capacitors. The current flowing through the closed circuit can then be measured by a current sensor that is in series with the AC signal source. If all of the grid relays are open, then there is no path (that involves a grid relay) for current to flow from, and return to the AC signal source. An example of such an AC signal source and current source coupled, via a network of coupling capacitors, to the terminals of multiple grid relays is shown in the example of FIG. 5.

Further embodiments regarding testing circuits and detection of grid relay state are described above.

Embodiments of the grid relay testing (including grid relay state detection and fault detection processing) described herein may be performed in a variety of contexts. As one example, for compliance, testing of grid relays (to see if any of them are faulted) is performed when going from off grid to on grid (e.g., when connecting the onsite power system to the utility grid). In some embodiments, the grid relay testing is also performed when the onsite power system goes from on grid to off grid (disconnection of site power system from utility grid).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A grid relay state detector, comprising:
   an AC (Alternating Current) signal source capacitively coupled to at least one grid relay via at least one coupling capacitor, wherein a capacitance of the at least one coupling capacitor is sized to be larger than a capacitance of a network of one or more EMI (electromagnetic interference) suppression capacitors that is across the at least one grid relay; and
   a current sensor that detects an amount of AC current flowing through the at least one grid relay;
   wherein a state of the at least one grid relay is determined based at least in part on the detected amount of AC current.

2. The grid relay state detector of claim 1, wherein the at least one grid relay is determined to be open or closed.

3. The grid relay state detector of claim 1, further comprising one or more processors, wherein the one or more processors are configured to determine whether there is a fault with the at least one grid relay.

4. The grid relay state detector of claim 3, wherein the one or more processors determine whether there is a fault with the at least one grid relay at least in part by comparing the determined state of the at least one grid relay against an expected state of the at least one grid relay.

5. The grid relay state detector of claim 1, wherein the state of the at least one grid relay is determined in response to a command to close the at least one grid relay.

6. The grid relay state detector of claim 5, wherein the commanding of the closing of the at least one grid relay is associated with connection of a site power system to a utility grid.

7. The grid relay state detector of claim 1, wherein the AC source is capacitively coupled to a plurality of grid relays.

8. The grid relay state detector of claim 7, wherein any one of the grid relays in the plurality of grid relays being closed causes AC current to be detected by the current sensor.

9. The grid relay state detector of claim 1, wherein the AC source is capacitively coupled across terminals of the at least one grid relay.

10. The grid relay state detector of claim 9, wherein a first terminal of the at least one grid relay is coupled to a site power system, and wherein a second terminal of the at least one grid relay is coupled to a utility grid.

11. A method, comprising:
  detecting, by a current sensor, an amount of AC (Alternating Current) current flowing through at least one grid relay, wherein an AC signal source is capacitively coupled to the at least one grid relay via at least one coupling capacitor, and wherein a capacitance of the at least one coupling capacitor is sized to be larger than a capacitance of a network of one or more EMI (electromagnetic interference) suppression capacitors that is across the at least one grid relay; and
  determining a state of the at least one grid relay based at least in part on the detected amount of AC current.

12. The method of claim 11, wherein the at least one grid relay is determined to be open or closed.

13. The method of claim 11, further comprising determining whether there is a fault with the at least one grid relay.

14. The method of claim 13, wherein whether there is a fault with the at least one grid relay is determined at least in part by comparing the determined state of the at least one grid relay against an expected state of the at least one grid relay.

15. The method of claim 11, wherein the state of the at least one grid relay is determined in response to a command to close the grid relay.

16. The method of claim 15, wherein the commanding of the closing of the at least one grid relay is associated with connection of a site power system to a utility grid.

17. The method of claim 11, wherein the AC source is capacitively coupled to a plurality of grid relays.

18. The method of claim 17, wherein any one of the grid relays in the plurality of grid relays being closed causes AC current to be detected by the current sensor.

19. The method of claim 11, wherein the AC source is capacitively coupled across terminals of the at least one grid relay.

20. The method of claim 19, wherein a first terminal of the at least one grid relay is coupled to a site power system, and wherein a second terminal of the at least one grid relay is coupled to a utility grid.

* * * * *